(12) United States Patent
Chadwick et al.

(10) Patent No.: US 7,805,693 B2
(45) Date of Patent: Sep. 28, 2010

(54) IC CHIP DESIGN MODELING USING PERIMETER DENSITY TO ELECTRICAL CHARACTERISTIC CORRELATION

(75) Inventors: Laura S. Chadwick, Essex Junction, VT (US); James A. Culp, Downingtown, PA (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 12/031,734

(22) Filed: Feb. 15, 2008

(65) Prior Publication Data

US 2009/0210834 A1    Aug. 20, 2009

(51) Int. Cl.
 *G06F 17/50* (2006.01)
(52) U.S. Cl. .............. 716/5; 716/4; 716/6; 716/8; 703/14
(58) Field of Classification Search ........ 716/4–6, 716/8; 703/14
See application file for complete search history.

(56) References Cited

U.S. PATENT DOCUMENTS

| | | | | |
|---|---|---|---|---|
| 5,187,668 A * | 2/1993 | Okude et al. | ................. | 716/8 |
| 6,303,975 B1 * | 10/2001 | Groves et al. | ................. | 257/594 |
| 6,624,031 B2 * | 9/2003 | Abadeer et al. | ................. | 438/268 |
| 6,795,952 B1 * | 9/2004 | Stine et al. | ................. | 716/5 |
| 6,996,797 B1 * | 2/2006 | Liebmann et al. | ................. | 716/19 |
| 7,289,933 B2 | 10/2007 | Luo et al. | | |
| 7,305,334 B2 * | 12/2007 | Graur et al. | ................. | 703/14 |
| 2003/0011390 A1 * | 1/2003 | Smith et al. | ................. | 324/754 |
| 2003/0217344 A1 * | 11/2003 | Ito et al. | ................. | 716/6 |
| 2007/0118320 A1 * | 5/2007 | Luo et al. | ................. | 702/117 |
| 2008/0286887 A1 * | 11/2008 | Goo et al. | ................. | 438/15 |

OTHER PUBLICATIONS

Mehrotra, "Modeling the Effects of Systematic Process Variation on Circuit Performance," Massachusetts Institute of Technology, May 2001, 156 pages.
Kahng et al., "Filling Algorithms and Analyses for Layout Density Control," IEEE Transactions on Computer-Aided Design of Integrated Circuits and Systems, vol. 18, No. 4, Apr. 1999, pp. 445-462.
Kahng, "IC Layout and Manufacturability: Critical Links and Design Flow Implications," 12th International Conference on VLSI Design, Jan. 1999, 6 pages.

* cited by examiner

*Primary Examiner*—Naum B Levin
(74) *Attorney, Agent, or Firm*—Richard Kotulak; Hoffman Warnick LLC

(57) ABSTRACT

IC chip design modeling using perimeter density to an electrical characteristic correlation is disclosed. In one embodiment, a method may include determining a perimeter density of conductive structure within each region of a plurality of regions of an integrated circuit (IC) chip design; correlating a measured electrical characteristic within a respective region of an IC chip that is based on the IC chip design to the perimeter density; and modeling the IC chip design based on the correlation.

15 Claims, 4 Drawing Sheets

IC CHIP DESIGN MODELING USING PERIMETER DENSITY TO ELECTRICAL CHARACTERISTIC CORRELATION

BACKGROUND

1. Technical Field

The disclosure relates generally to integrated circuit (IC) chip design, and more particularly, to IC chip design modeling.

2. Background Art

In integrated circuit (IC) chip design, analysis is performed on an IC design to determine both performance and power based on a model. The model correlates known structural characteristics to given electrical characteristics such that any IC design can be evaluated. For example, conventional processes correlate structure size, area density (e.g., for fill) or proximity (using optical proximity correction) to model electrical characteristics. In addition, a structure's location on the IC chip can drastically impact performance based on geometric variations, e.g., 10-15% differences in performance across an IC chip. Conventionally, uncorrelated systematic variations are considered random.

SUMMARY

IC chip design modeling using perimeter density to an electrical characteristic correlation is disclosed. In one embodiment, a method may include determining a perimeter density of conductive structure within each region of a plurality of regions of an integrated circuit (IC) chip design; correlating a measured electrical characteristic within a respective region of an IC chip that is based on the IC chip design to the perimeter density; and modeling the IC chip design based on the correlation.

A first aspect of the disclosure provides a method comprising: determining a perimeter density of conductive structure within each region of a plurality of regions of an integrated circuit (IC) chip design; correlating a measured electrical characteristic within a respective region of an IC chip that is based on the IC chip design to the perimeter density; and modeling the IC chip design based on the correlation.

A second aspect of the disclosure provides a system comprising: means for determining a perimeter density of conductive structure within each region of a plurality of regions of an integrated circuit (IC) chip design; means for correlating a measured electrical characteristic within a respective region of an IC chip that is based on the IC chip design to the perimeter density; and means for modeling the IC chip design based on the correlation.

A third aspect of the disclosure provides a program product stored on a computer-readable medium, which when executed, models an integrated circuit (IC) chip design, the program product comprising: program code for determining a perimeter density of conductive structure within each region of a plurality of regions of the IC chip design; program code for correlating a measured electrical characteristic within a respective region of an IC chip that is based on the IC chip design to the perimeter density; and program code for modeling the IC chip design based on the correlation.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1B:
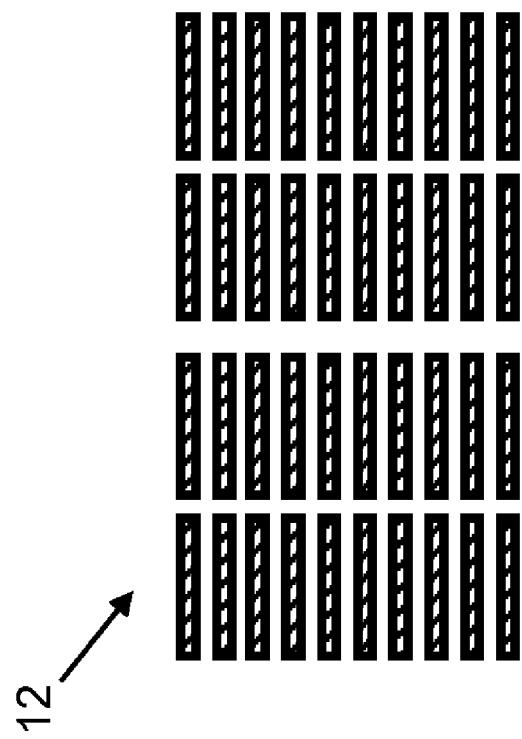
FIGS. 1A-B show illustrative regions with conductive structure having different perimeter density.
Figure 1A:
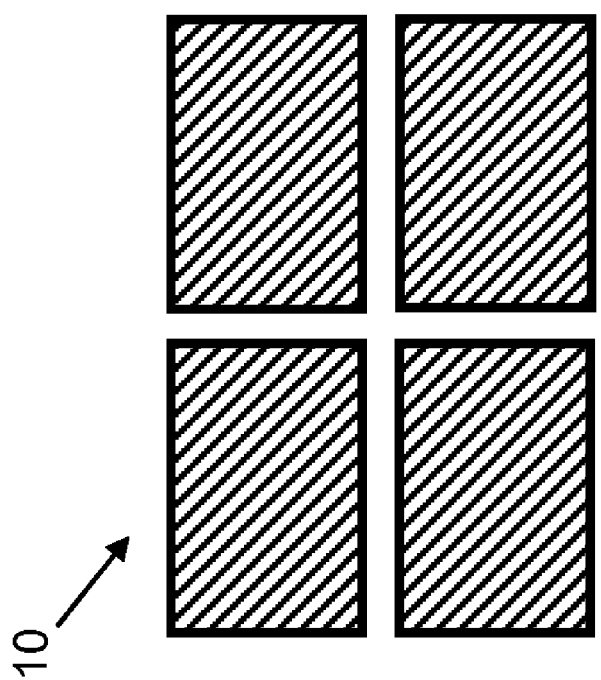

Perimeter density of an integrated circuit (IC) chip is the perimeter of polysilicon in a layer of the IC chip per unit area. That is, for a given region of an IC chip, the perimeter density is equal to the sum of polyconductor (PC) perimeter divided by the area of that given region. FIG. 1A shows a region with 4 decoupling capacitors 10. This region has a relatively low perimeter density equal to the cumulative length of the dark line about the four rectangles divided by the area of the region. In contrast, FIG. 1B shows a static random access memory (SRAM) array 12 that has a relatively high perimeter density equal to the cumulative length of the dark line about the forty rectangles divided by the area of the region. Perimeter density is different than structural density which is area of structures divided by area of region at issue.

The present disclosure recognizes that with each technology generation, the structural density within an IC chip may remain fairly constant, however, the perimeter density increases. As a result, any electrical characteristic attributable to or correlated with perimeter density for any level will become successively worse with each technology node.

A NAND gate in a high perimeter density area may be timed faster than one in a lower perimeter density area. Conventionally, such systematic variations have been considered random. Furthermore, systematic variations such as perimeter density that occur over a large area, e.g., 100 micrometers by 100 micrometers regions, have been ignored because they are impossible to consider in a simulation model or an extraction/hierarchy because it prevents design verification. However, the present disclosure recognizes that systematic within-chip variations can be correlated to perimeter density, allowing modeling over a large area.

Figure 2:
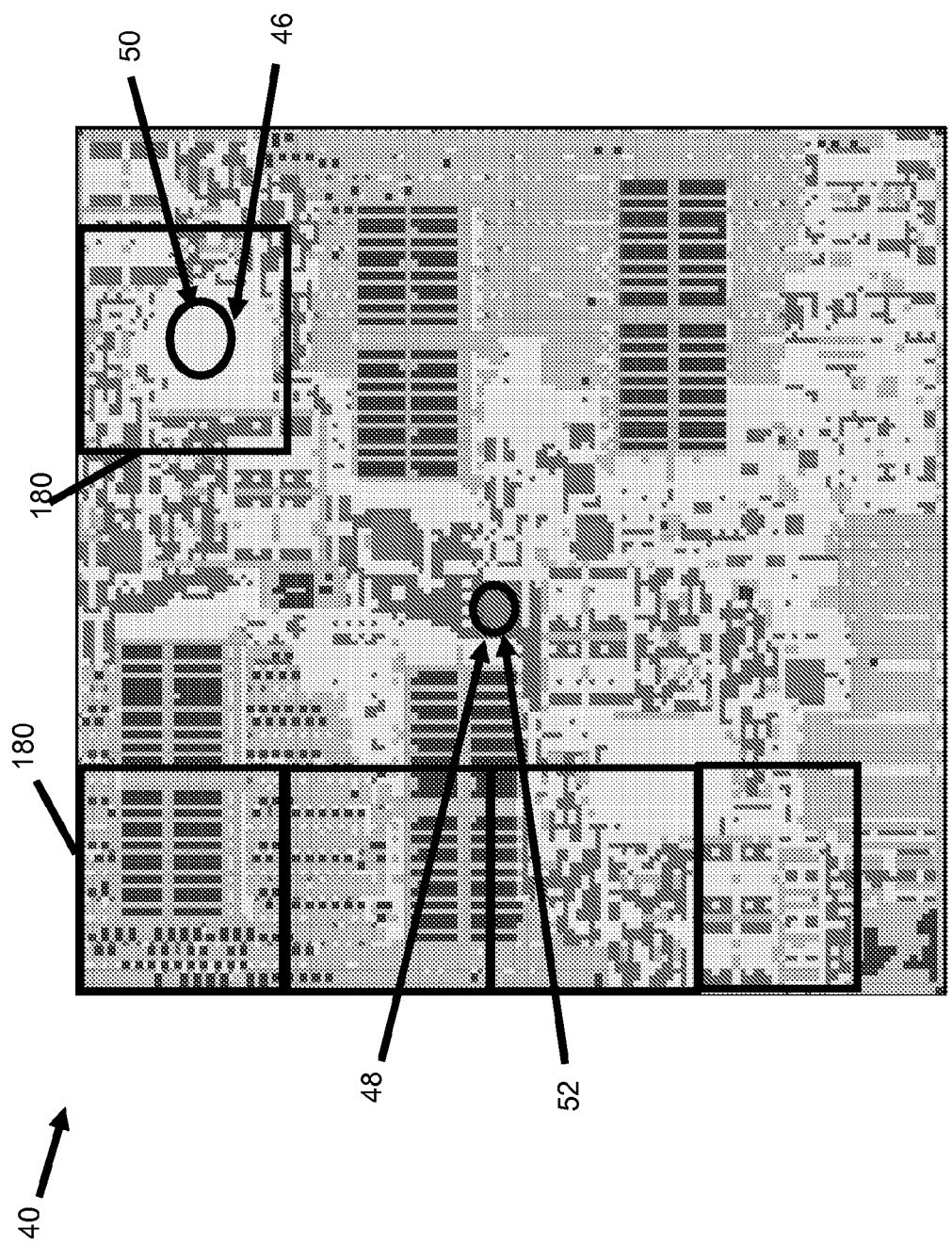
FIG. 2 shows an illustrative visual representation of a perimeter density map. This map can be correlated to an electrical characteristic according to the disclosure.

FIG. 2 shows a visual representation 40 of one level of an IC chip in which (lighter gray) region 46 indicates a low perimeter density, and (darker gray) region 48 indicates a high perimeter density. In one embodiment, visual representation 40 is in the form of a color coded map, however, a variety of other forms of visual representation may be employed. High perimeter density region 48 may include, for example, densely packed intricate shapes with high levels of perimeter, while low perimeter density region 46 may include, for example, larger shapes with lower levels of perimeter. Ring oscillators 50, 52 for testing performance are indicated within circles. Ring oscillators 50 within low perimeter density region 46 always run slower than ring oscillators 52 within the high perimeter density region 48, which is contrary to conventional assumptions that dictate random performance variations. In an alternative embodiment, visual representation 40 may indicate perimeter density compared to an electrical characteristic. In this case, both the lower perimeter density region 46 (light gray) and the higher perimeter density region 48 (dark gray) would have performance (e.g., timing and power) that would deviate from prediction.

Figure 3:
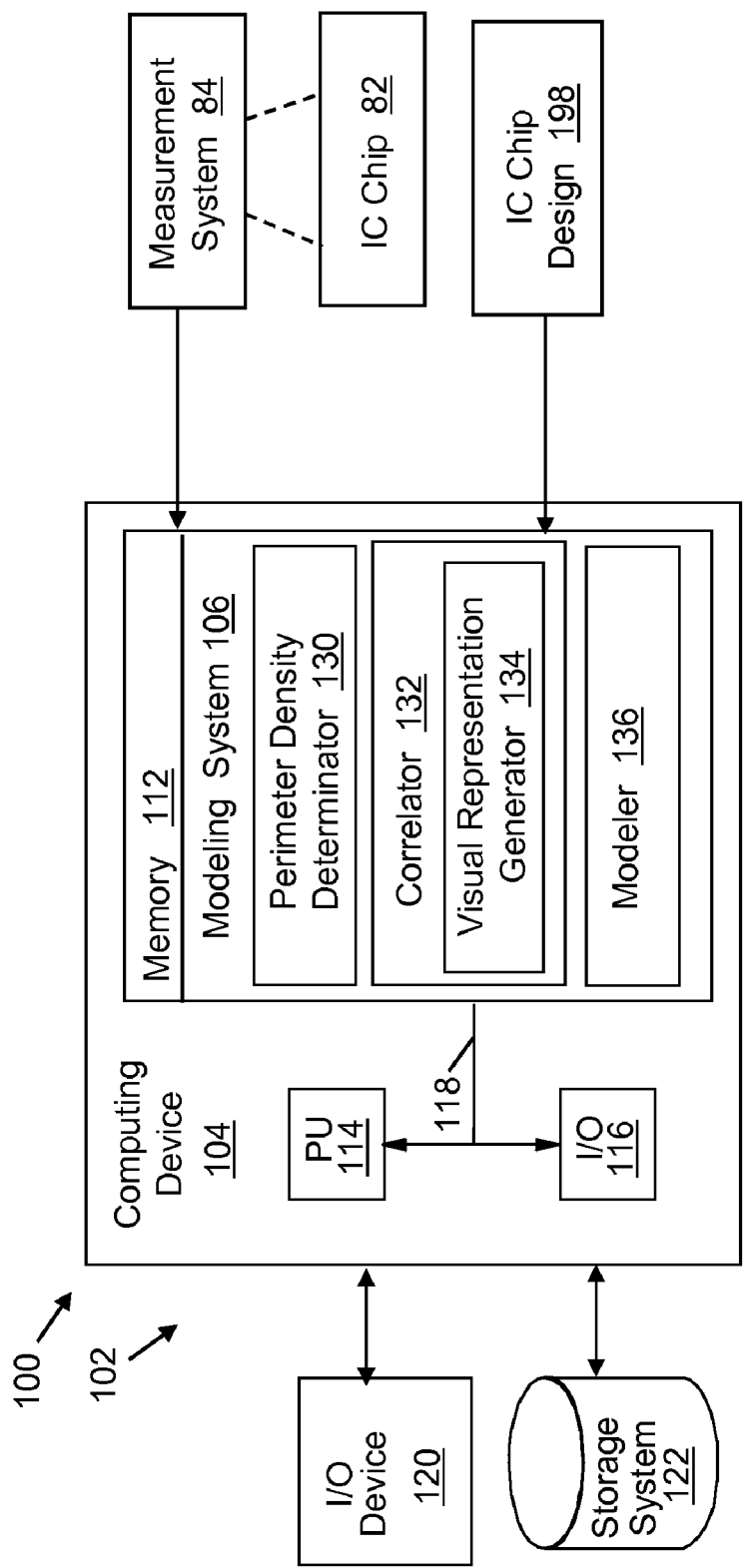
FIG. 3 shows a block diagram of a computer infrastructure according to the disclosure.

Turning to FIG. 3, an illustrative environment 100 for IC design modeling using perimeter density to electrical characteristic correlations is illustrated. To this extent, environment 100 includes a computer infrastructure 102 that can perform the various process steps described herein for IC design modeling using perimeter density to electrical characteristic correlations. In particular, computer infrastructure 102 is shown including a computing device 104 that comprises a modeling system 106, which enables computing device 104 to model an IC design using perimeter density to electrical characteristic correlations by performing the process steps of the disclosure.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as modeling system 106, that is stored in memory 112 and/or storage system 122. While executing computer program code, processor 114 can read and/or write data, such as modeling, to/from memory 112, storage system 122, and/or I/O interface 116. Bus 118 provides a communications link between each of the components in computing device 104. I/O device 118 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and modeling system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As previously mentioned and discussed further below, modeling system 106 enables computing infrastructure 102 to model electrical characteristics using perimeter density. To this extent, modeling system 106 is shown including a perimeter density determinator 130, a correlator 132 including a visual representation generator 134, and a modeler 136. Operation of each of these systems is discussed further below. However, it is understood that some of the various systems shown in FIG. 3 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 4:
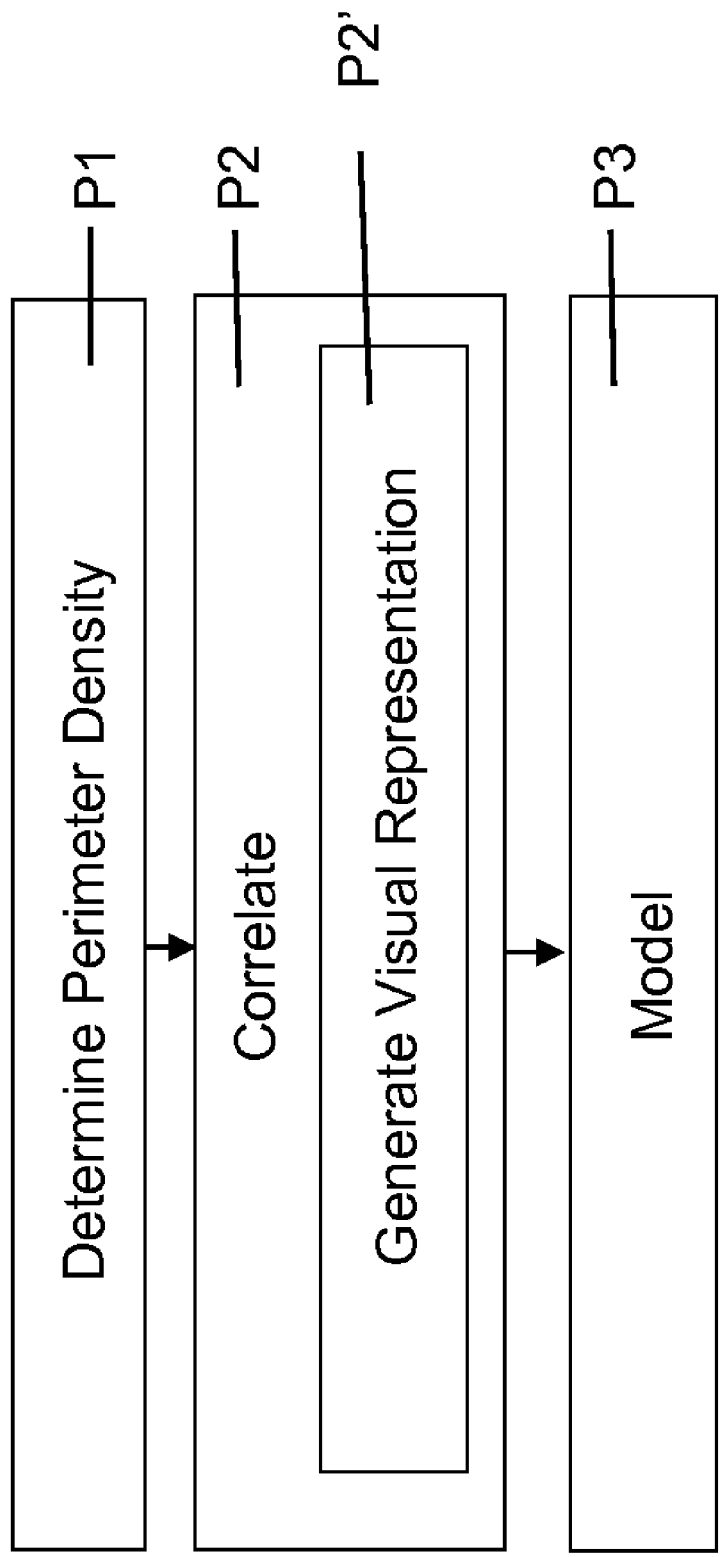
FIG. 4 shows a flow diagram of embodiments of an operational methodology according to the disclosure.

Referring to FIG. 3 in conjunction with the flow diagram of FIG. 4, embodiments of an operational methodology of modeling system 106 will now be described. In process P1, perimeter density determinator 130 determines a perimeter density of a conductive structure(s) within each region of a plurality of regions of an integrated circuit (IC) chip design. As shown in FIG. 2, each layer of an IC chip design may be segmented into regions 180 (only a few shown). The perimeter density may then be calculated in any now known or later developed fashion, for example, by summing the polygon edge length within an area, and dividing that sum by the area bounding the summed edges. In one embodiment, determinator 130 determines the perimeter density in successively larger radii about a center of the respective region, wherein the center is the location of the electrical characteristic measurement. The successive larger radii improves the accuracy of the model by ensuring that the respective region is smaller than the region of interest of the modeled phenomenon to ensure that adequate sampling of the region's environment is made.

In process P2, correlator 132 correlates a measured electrical characteristic within a respective region 180 (FIG. 2) of an IC chip 82 (FIG. 1) that is based on the IC chip design to the perimeter density. The electrical characteristic measuring may include using, for example, a performance screen ring oscillator (PSRO) 50, 52 or other testing structure in a respective region of an actual, manufactured IC chip 82 (FIG. 3). The measurement may be performed using any now known or later developed measurement system 84 (FIG. 3) such as discrete devices for extracting parameters, or PSRO's, or power monitors, etc. Other testing structure may include, for example, built in self testing (e.g., logic BIST or analog BIST). An alternative process P2' may include visual representation generator 134 generating a visual representation of the perimeter density. Alternatively, visual representation generator 134 may generate a visual representation of the perimeter density compared to the electrical characteristic. In any event, the visual representation may take the form of any now known or later developed illustration such as, but not limited to: a grayscale map, a color coded map, etc.

In process P3, modeler 136 model IC chip design 198 based on the correlating. Modeler 136 may include any now known or later developed modeling system such as Matlab available from Mathworks, Boston, Mass. For example, modeler 136 may perform nonlinear multivariate modeling for the highly correlated geometries. As a result, modeling system 106 allows estimating of a parametric quantity of a very large scale integrated circuit (VLSI) design by means of correlating the perimeter density of drawn design layers with electrical characteristics of a manufactured circuit.

As discussed herein, various systems and components are described as "obtaining" data (e.g., IC chip measurements, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system for modeling using perimeter density to electrical characteristic correlations, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to model using perimeter density to electrical characteristic correlations. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as memory 122, magnetic tape, a removable computer diskette, a random access memory (RAM), a read-only memory (ROM), a tape, a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processing unit 114 coupled directly or indirectly to memory elements through a system bus 118. The memory elements can include local memory, e.g., memory 112, employed during actual execution of the program code, bulk storage (e.g., memory system 122), and cache memories which provide temporary storage of at least some program code in order to reduce the number of times code must be retrieved from bulk storage during execution.

In another embodiment, the disclosure provides a method of generating a system for modeling using perimeter density to electrical characteristic correlations. In this case, a computer infrastructure, such as computer infrastructure 102 (FIG. 3), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 3), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider (ASP), could offer to model using perimeter density to electrical characteristic correlations as described herein. In this case, the service provider can manage (e.g., create, maintain, support, etc.) a computer infrastructure, such as computer infrastructure 102 (FIG. 3), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:

determining, on at least one computing device, a perimeter density of conductive structure within each region of a plurality of regions of an integrated circuit (IC) chip design;

correlating, on the at least one computing device, a measured electrical characteristic within a respective region of an IC chip that is based on the IC chip design to the perimeter density; and modeling, on the at least one computing device, the IC chip design based on the correlation.

2. The method of claim 1, further comprising generating, on the at least one computing device, a visual representation of the perimeter density.

3. The method of claim 1, further comprising generating, on the at least one computing device, a visual representation of the perimeter density compared to the electrical characteristic.

4. The method of claim 1, wherein the measured electrical characteristic is measured using a performance screen ring oscillator (PSRO) in a respective region of the IC chip.

5. The method of claim 1, wherein the perimeter density determining includes:

determining, on the at least one computing device, the perimeter density in successively larger radii about a center of the respective region, wherein the center is a location where the measured electrical characteristic is measured.

6. A system comprising:

a perimeter density determinator for determining a perimeter density of conductive structure within each region of a plurality of regions of an integrated circuit (IC) chip design;

a correlator for correlating a measured electrical characteristic within a respective region of an IC chip that is based on the IC chip design to the perimeter density; and a modeler for modeling the IC chip design based on the correlation.

7. The system of claim 6, further comprising a visual representation generator for generating a visual representation of the perimeter density.

8. The system of claim 6, further comprising a visual representation generator for generating a visual representation of the perimeter density compared to the electrical characteristic.

9. The system of claim 6, further comprising an electrical characteristic measuring system including a performance screen ring oscillator (PSRO) in a respective region of the IC chip.

10. The system of claim 6, wherein the perimeter density determinator determines the perimeter density in successively larger radii about a center of the respective region, wherein the center is a location where the measured electrical characteristic is measured.

11. A computer program comprising program code embodied in at least one computer-readable storage medium, which when executed, enables a computer system to implement a method of modeling an integrated circuit (IC) chip design, the method comprising:

determining a perimeter density of conductive structure within each region of a plurality of regions of the IC chip design;

correlating a measured electrical characteristic within a respective region of an IC chip that is based on the IC chip design to the perimeter density; and for modeling the IC chip design based on the correlation.

12. The computer program of claim 11, further comprising generating a visual representation of the perimeter density.

13. The computer program of claim 11, further comprising generating a visual representation of the perimeter density compared to the electrical characteristic.

14. The computer program of claim 11, further comprising measuring an electrical characteristic using a performance screen ring oscillator (PSRO) in a respective region of the IC chip.

15. The computer program of claim 11, wherein determining the perimeter density determines the perimeter density in successively larger radii about a center of the respective region, wherein the center is the location of the electrical characteristic measurement.

* * * * *